United States Patent [19]

Ishigaki

[11] Patent Number: 5,245,209
[45] Date of Patent: Sep. 14, 1993

[54] SEMICONDUCTOR DEVICE INCLUDING COMPLEMENTARY INSULATING GATE FIELD EFFECT TRANSISTORS AND BIPOLAR TRANSISTORS IN SEMICONDUCTOR SUBSTRATE

[75] Inventor: Yoshiyuki Ishigaki, Itami, Japan

[73] Assignee: Mitsubishi Denki Kabushiki Kaisha, Tokyo, Japan

[21] Appl. No.: 798,096

[22] Filed: Nov. 27, 1991

[30] Foreign Application Priority Data

Dec. 7, 1990 [JP] Japan ................... 2-400959
Nov. 14, 1991 [JP] Japan ................... 3-298887

[51] Int. Cl.$^5$ ............... H01L 29/76; H01L 29/94; H01L 29/00; H01L 29/167
[52] U.S. Cl. .................. 257/370; 257/371; 257/372; 257/552; 257/607
[58] Field of Search ............... 357/41, 42, 43, 91; 257/370, 371, 372, 373, 552, 607

[56] References Cited

U.S. PATENT DOCUMENTS 4,694,562 9/1987 Iwasaki et al. .................. 357/43

FOREIGN PATENT DOCUMENTS 0398247 11/1990 European Pat. Off. .
0206153 1/1983 Japan .
0154655 8/1985 Japan .
64-82648 3/1989 Japan .
1259554 10/1989 Japan .
2106961 4/1990 Japan .
2252243 10/1990 Japan .

Primary Examiner—William Mintel
Assistant Examiner—Wael Fahmy
Attorney, Agent, or Firm—Lowe, Price, LeBlanc & Becker

[57] ABSTRACT

The impurity concentration of an n+ buried layer 51a in the region for forming a p channel MOS transistor 23 is higher than the impurity concentration of an n+ buried layer 3a in the region for forming an npn bipolar transistor 21. N+ buried layers 3a and 51a are formed on a p type silicon substrate 1. An n− well region 10 is formed as a region for forming npn bipolar transistor 21 on n+ buried layer 3a. An n well region 12 is formed as a region for forming p channel MOS transistor 23 on n+ buried layer 51a. While the performance of npn bipolar transistor 21 is maintained, the performance of a CMOS transistor formed of an n channel MOS transistor 22 and p channel MOS transistor 23 is improved. In a Bi-CMOS semiconductor device, the performance of a bipolar transistor portion is maintained, while preventing the formation of a punch through and improving the latch up tolerance of a CMOS transistor portion.

12 Claims, 15 Drawing Sheets

SEMICONDUCTOR DEVICE INCLUDING COMPLEMENTARY INSULATING GATE FIELD EFFECT TRANSISTORS AND BIPOLAR TRANSISTORS IN SEMICONDUCTOR SUBSTRATE

BACKGROUND OF THE INVENTION

1. Field of the Invention

The present invention relates generally to a semiconductor device such as a large scale integrated circuit device (LSI), etc., and more specifically to a semiconductor device including complementary insulating gate field effect transistors and bipolar transistors in a chip (semiconductor substrate). The present invention is especially applicable to a semiconductor device of a so-called Bi-COMS (Bipolar-Complementary Metal Oxide Semiconductor) type. The present invention also relates to the manufacturing method of such a semiconductor device.

2. Description of the Background Art

The present invention brings about the most preferable effects when applied to an LSI including CMOS transistors along with bipolar transistors in a chip, i.e. a so-called Bi-CMOS type semiconductor device. FIGS. 24 to 29 are sectional views showing the manufacturing method of a conventional Bi-CMOS type semiconductor device in the manufacturing order. The structure of the Bi-CMOS type semiconductor substrate and the manufacturing method thereof will be described in conjunction with these figures.

Referring to FIG. 24, a silicon oxide film is formed on a p type silicon semiconductor substrate 1 by, for example, thermal oxidation, etc. The silicon oxide film is patterned to form silicon oxide films 2a, 2b, and 2c, which expose prescribed regions. Using silicon oxide films 2a, 2b, and 2c as masks, an N type impurity such as antimony (Sb), etc. is introduced into p type silicon semiconductor substrate 1 by means of ion implantation, etc. and is diffused. N+ diffusion layers 3 and 5 are thus formed at one time.

Now, referring to FIG. 25, silicon oxide film 2a, 2b, and 2c are removed. Then a silicon oxide film 6 is once again formed entirely on p type silicon semiconductor substrate 1. A photoresist film is formed on silicon oxide film 6. The photoresist film is patterned to form photoresist films 7a and 7b to expose only a prescribed surface region of silicon oxide film 6. Using photoresist films 7a and 7b as masks, a p type impurity such as boron (B), etc. is introduced into p type silicon semiconductor substrate 1 and is diffused. A p+ diffusion layer 8 is thus formed.

Thereafter, photoresist films 7a and 7b, and silicon oxide film 6 are sequentially removed as shown in FIG. 26.

As shown in FIG. 27, epitaxial growth is performed to grow a silicon layer entirely on p type silicon semiconductor substrate 1. An epitaxial layer 9 having a thickness of approximately 2 μm is thus formed. At that time, n+ diffusion layers 3 and 5, and a p+ diffusion layer 8 become n+ buried layers 3a and 5a, and a p+ buried layer 8a by the process of thermal treatment during the process of the epitaxial growth.

Referring to FIG. 28, an n type impurity such as phosphorus is, for example, introduced into epitaxial layer 9 above n+ buried layers 3a and 5a by ion implantation, etc.. The diffusion of the n type impurity permits n− well regions 10 and 12 to be formed above n+ buried layers 3a and 5a, respectively. A p type impurity such as boron (B) is introduced into epitaxial layer 9 above p+ buried layer 8a by ion implantation, etc.. The diffusion of the p type impurity permits p− well region 11 to be formed above p+ buried layer 8a. After these n− regions 10, 12 and p− well region 11 are sequentially formed, oxide films for element isolation 13a to 13e are formed for example by means of LOCOS (Local Oxidation of Silicon).

Finally, as shown in FIG. 29, an n type impurity such as phosphorus (P) is diffused in a region between oxide films for element isolation 13a and 13b, thereby forming an n+ diffusion layer for conducting a collector 14. Sequentially formed thereafter are the elements of MOS transistors: gate oxide films 15a and 15b; gate electrodes 16a and 16b; n+ source/drain diffusion layers 17a and 17b; and p+ source/drain diffusion layers 18a and 18b;, and the elements of bipolar transistors: a p+ diffusion layer 18c for conducting a base; a p− intrinsic base region 19; and an n+ emitter region 20.

As described above, an npn bipolar transistor 21, an n channel MOS transistor 22, a p channel MOS transistor 23 are formed, which constitute a Bi-CMOS type semiconductor device as a whole.

As shown in FIG. 24, n+ buried layer 3a is formed by implantation of antimony, in which npn bipolar transistor 21 is formed, the background of which will be described in the following.

It is conventionally known that reducing the size of a bipolar transistor according to the scaling law brings about cost reduction due to increase in the integration density as well as improvement in the operating speed of the transistor due to reduction in parasitic capacitance, parasitic resistance and carrier running time. It has been apparent that as the thickness of, for example, a silicon epitaxial layer is reduced according to the scaling law, $f_T$ (cut-off frequency) which is an indicator of high speed operation achieved by the bipolar transistor increases as shown in FIG. 30, but the collector-emitter breakdown voltage $BV_{CEO}$ is tremendously degraded.

The thickness of a silicon epitaxial layer is scaled to as thick as 2 μm and less, and it is a major issue how to secure $BV_{CEO}$ while achieving high speed operation of a bipolar transistor.

The following two approaches are possible for securing the $BV_{CEO}$.

(i) In the conventional Bi-CMOS type semiconductor device shown in FIG. 29, for example, the impurity concentration of intrinsic base region 19 in npn bipolar transistor 21 is increased.

(ii) In the conventional Bi-CMOS type semiconductor device shown in FIG. 29, the impurity concentration of n− well region 10 is reduced while restraining the rising of n+ buried layer 3a onto the side of epitaxial layer 9 due to auto doping as much as possible. The impurity concentration of n+ buried layer 3a itself should be increased as much as possible for the purpose of reducing the parasitic resistance.

The term "auto doping" refers to the phenomenon in which an impurity in a substrate once jumps into vapor phase during the growth of epitaxial layer 9 and is once again taken up into the epitaxial layer. For example, FIG. 31 illustrates the impurity concentration profile of a typical npn bipolar transistor in its depthwise direction, and it can be understood from this figure that a gentle slope Q is produced on the side of the epitaxial layer (epi layer) in the impurity concentration profile of the n+ buried layer.

More specifically, the auto doping phenomenon is essentially different from so-called outward diffusion in which an impurity diffuses directly from a substrate during epitaxial growth.

In the case of (i), increase of the impurity concentration of intrinsic base region 19 results in great degradation in the current amplification factor $h_{FE}$ which is one important characteristic of a bipolar transistor. This is because $h_{FE}$ which is approximately represented by the equation:

$$h_{FE}=N_E/(N_B W_B)$$

(where $N_E$ is emitter concentration, $N_B$ is base concentration, and $W_B$ is base width) is degraded when the base concentration $N_B$ increases.

As a result, it is difficult to maintain $h_{FE}$ at a level around 100 possessed by a general bipolar transistor and the approach of (i) can hardly be reduced to practice.

In the case of (ii), too much reduction in the impurity concentration of n− well region 10 results in the diffusion of the impurity forming p− intrinsic base region 19, increases the base width $W_B$ and degrades $h_{FE}$ as in the above-stated equation representing $h_{FE}$ or $f_T$ is degraded by increase of the base running time, thereby hindering high speed operation of the transistor. Consequently, the impurity concentration of n− well region 10 can only be reduced to somewhere around $10^{16}/cm^3$ in practice.

It is therefore necessary to use an impurity less subject to auto doping in order to restrain the rising of n+ buried layer 3a onto the side of epitaxial layer 9 due to the auto doping as much as possible.

FIG. 32 is a graphic representation showing the temperature dependence of the diffusion coefficients of n type impurities, phosphorus (P), arsenic (As) and antimony (Sb) in the silicon. According to FIG. 32, the relation between the diffusion coefficients in the silicon in a prescribed temperature range is represented as phosphorus (P) > antimony (Sb) > arsenic (As). Unlike outward diffusion, the auto doping does not depend on the diffusion coefficients themselves as shown in FIG. 32. The auto doping varies with the conditions of silicon epitaxial growth, specially the kind of dopant used, and the relation between the coefficients of n type impurities is represented as phosphorus (P) > arsenic (As) > > antimony (Sb).

For the reasons stated above, antimony (Sb) is used for forming n+ buried layer 3a with the impurity concentration of n− well region 10 being approximately $10^{16}/cm^3$, in order to achieve high speed operation of the bipolar transistor while securing $BV_{CEO}$ by scaling the silicon epitaxial layer.

In the usual manufacture of Bi-CMOS type semiconductor devices, n− well region 10 as the region in which npn bipolar transistor 21 is to be formed is formed as shown in FIG. 28 simultaneously with and having the same impurity concentration as n− well region 12 as the region in which p channel MOS transistor 23 is to be formed. Also, as can be seen from FIGS. 24 and 27, n+ buried layer 3a in which npn bipolar transistor 21 is to be formed is formed simultaneously with and having the same impurity concentration as n+ buried layer 5a in which p channel MOS transistor 23 is to be formed.

Therefore, if the impurity concentration of n− well region 10 is reduced to $10^{16}/cm^3$ for preventing deterioration in the bipolar transistor performance, and antimony (Sb) is used as an impurity for the formation of n+ buried layer 3a as described above, the impurity concentration of n− well region 12 on which p channel MOS transistor 23 is to be formed will be reduced to $10^{16}/cm^3$ as well. This causes the drain depletion layer in the p channel MOS transistor to be easily expanded, thereby facilitating the formation of a punch through between source/drain. "Punch through" means a phenomenon in which a drain depletion layer extends close to a source, the drain depletion layer and the source depletion layer are connected with each other and therefore the electric field in the drain has an effect on the source side, resulting in the drop of the diffusion potential between source well, so that current flows between the source-drain without the formation of a channel. An approach for preventing only the formation of this punch through phenomenon has been proposed by the present inventors et al in Japanese Patent Laying-Open No. 2-106961, which discloses the keeping of the impurity concentration higher in n− well region 10 on which the p channel MOS transistor is to be formed than in n− well region 10.

Also as shown in FIG. 29, n+ buried layer 3a to be used as the collector of the bipolar transistor has preferably its resistance kept low i.e. its concentration kept higher as described above. If antimony (Sb) is used as an impurity in the formation of n+ buried layer 3a, there is a limit to its high concentration. FIG. 33 is a graphic representation showing the solid solubilities of Arsenic (As), phosphorus (P), and antimony (Sb) into silicon. As shown in FIG. 33, the solid solubility of antimony (Sb) into silicon is lower than those of the other n type impurities arsenic (As) and phosphorus (P). The highest concentration of n+ buried layer 3a formed using antimony (Sb) in practice is therefore only about $10^{19}/cm^3$. The formation of p channel MOS transistor in n− well region 12 having a concentration as low as the above-described $10^{16}/cm^3$ makes it difficult to improve the latch up tolerance of a complementary MOS transistor.

Here, the term "latch up" indicates a phenomenon in which pnp and npn parasitic bipolar transistors are formed in a complementary MOS transistor, constituting a thyristor of pnpn between a power supply potential ($V_{DD}$) and a ground potential GND ($V_{SS}$), and once an extraneous noise is applied, current continues to flow between $V_{DD}$ and GND, resulting in breakdown.

FIG. 34 is a sectional view schematically showing one example of a parasitic thyristor formed in complementary MOS transistors in a Bi-CMOS type semiconductor device similar to the one illustrated by referring to FIG. 29. In FIG. 34, if the impurity concentrations of an n+ buried layer and a p+ buried layer are low, voltage drops (voltage drops corresponding to resistances Rn, Rp) become larger when a surge noise is applied and current flows through these buried layers. This causes the emitter-bases of a parasitic pnp bipolar transistor Q1 and a parasitic npn bipolar transistor Q2 to be biased. As a result, these parasitic transistors are operated, and, therefore, the above-described latch up phenomenon is more likely to happen.

Among other prior art devices, a semiconductor device is disclosed in Japanese Patent Laying-Open No. 64-82648, in which the depth to a buried layer in a bipolar transistor region is made shorter than the depth to a buried layer in an MOS transistor region. In the semiconductor device, as the thickness of an epitaxial layer is reduced in accordance with the scaling law, it becomes difficult to secure a breakdown voltage $VB_{CEO}$. In contrast, it will be necessary to increase the impurity concentration of a base region as described above for securing the breakdown voltage $VB_{CEO}$. The increase in the impurity concentration of the base region causes the current amplification factor $h_{FE}$ of the bipolar transistor to be decreased as described above. Consequently, it will be hard to maintain the bipolar transistor with a high performance.

Furthermore, Japanese Patent Laying-Open No. 1-259554 discloses a manufacturing method of a semiconductor device which uses impurities having different diffusion coefficients for forming the buried layer of a bipolar transistor region and the buried layer of an MOS transistor region. In practice, however, the kind of impurity for forming a buried layer has little influence on the characteristics of a transistor to be formed thereon. The position as well as the impurity concentration of the buried layer have in fact a great effect on the performance of the transistor. If the impurity concentration of an n+ buried layer itself is low, the formation of the n+ buried layer using an impurity having a large diffusion coefficient and the reduction of the region between the n+ buried layer and a p− base layer in a region for forming a bipolar transistor can instead give rise to other problems such as a large collector resistance. It is therefore difficult to maintain the performance of the bipolar transistor without taking into account the impurity concentration of the buried layer.

SUMMARY OF THE INVENTION

It is an object of the present invention to improve the performance of a complementary insulating gate field effect transistor and maintain a desired performance of a bipolar transistor without causing deterioration in a Bi-CMOS type semiconductor device.

Another object of the present invention is to prevent the formation of a punch through between the source-drain of a field effect transistor in a Bi-CMOS type semiconductor device.

Still another object of the present invention is to improve the latch up tolerance of a complementary insulating gate field effect transistor in a Bi-CMOS type semiconductor device.

A further object of the present invention is to manufacture a Bi-CMOS type semiconductor device having an improved performance of a complementary insulating gate field effect transistor and capable of maintaining a desired performance of a bipolar transistor.

A still further object of the present invention is to manufacture a Bi-CMOS type semiconductor device capable of preventing the formation of a punch through between the source-drain of a field effect transistor.

An additional object of the present invention is to manufacture a Bi-CMOS type semiconductor device having an improved latch up tolerance in a complementary insulating gate field effect transistor.

A semiconductor device in accordance with the present invention as one aspect includes a semiconductor substrate, a first buried semiconductor layer, a second buried semiconductor layer, a first semiconductor layer, a second semiconductor layer, a bipolar transistor, and a field effect transistor. The semiconductor substrate has a main surface. The first buried semiconductor layer includes impurities of a first conductivity type having a first concentration and is formed on the main surface of the semiconductor substrate. The second buried semiconductor layer includes impurities of the first conductivity type having a second concentration higher than the first concentration, and is formed on the main surface of the semiconductor substrate. The first semiconductor layer of the first conductivity type is formed on the first buried semiconductor layer. The second semiconductor layer of the first conductivity type is formed on the second buried semiconductor layer. The bipolar transistor uses as a base a semiconductor region of a second conductivity type formed in a region of the first semiconductor layer. The field effect transistor of the second conductivity type is formed in the region of the second semiconductor layer.

According to a manufacturing method of a semiconductor device in accordance with another aspect of the present invention, a first buried semiconductor layer including impurities of a first conductivity type having a first concentration is formed on a main surface of A semiconductor substrate. A second buried semiconductor layer including impurities of the first conductivity type having a second concentration higher than the first concentration is formed on the main surface of the semiconductor substrate. A first semiconductor layer of the first conductivity type is formed on the first buried semiconductor layer. A second semiconductor layer of the first conductivity type is formed on the second buried semiconductor layer. A bipolar transistor using a semiconductor region of a second conductivity type as a base is formed within a region of the first semiconductor layer. The field effect transistor of the second conductivity type is formed within a region of the second semiconductor layer.

In a semiconductor device in accordance with the present invention, the impurity concentration of the second buried semiconductor layer under the region in which the field effect transistor is formed is higher than the impurity concentration of the first buried semiconductor layer, and, therefore, the extension of the drain depletion layer of the field effect transistor in the direction toward the semiconductor substrate is greatly restrained. The formation of a punch through between the source-drain of the field effect transistor formed inside the second semiconductor layer may be prevented.

The high impurity concentration in the second buried semiconductor layer under the region in which the field effect transistor is formed restricts operation of two parasitic bipolar transistors constituting a parasitic thyristor. An improved latch up tolerance is thus obtained in a semiconductor device including complementary insulating gate field effect transistors as well as bipolar transistors.

Furthermore, a desired performance of the bipolar transistor portion can be maintained for the device in a state in which the performance of the complementary insulating gate field effect transistor is improved as described above, without deteriorating the bipolar transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the embodiments of the present invention will be described in conjunction with the drawings.

FIRST EMBODIMENT

FIGS. 1 to 10 are sectional views showing one embodiment of a manufacturing method of a Bi-CMOS type semiconductor device in accordance with the present invention in its manufacturing order.

Figure 1:
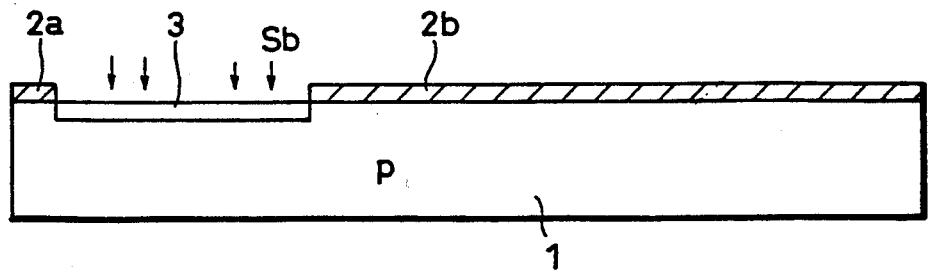
FIGS. 1 to 10 are sectional views showing a first embodiment of a manufacturing method of a semiconductor device in each manufacturing process in accordance with the present invention.

Referring to FIG. 1, a silicon oxide film having a thickness in the range of approximately 1000 to 3000Å is formed by means of thermal oxidation, etc. entirely of a p type silicon semiconductor substrate 1. The silicon oxide film is patterned by using conventional photolithographic technique and etching technique for silicon oxide film to form silicon oxide films 2a and 2b, so as to expose prescribed surface regions of p type silicon semiconductor substrate 1. Then, using the silicon oxide film 2a and 2b as masks, antimony (Sb) ions as an n type impurity are implanted into p type silicon semiconductor substrate 1 under about 50 keV and in a dose of about 1.0 to $5.0 \times 10^{16}/\text{cm}^2$. An n+ layer 3 is formed in a region above which an npn bipolar transistor is subsequently formed.

Figure 2:
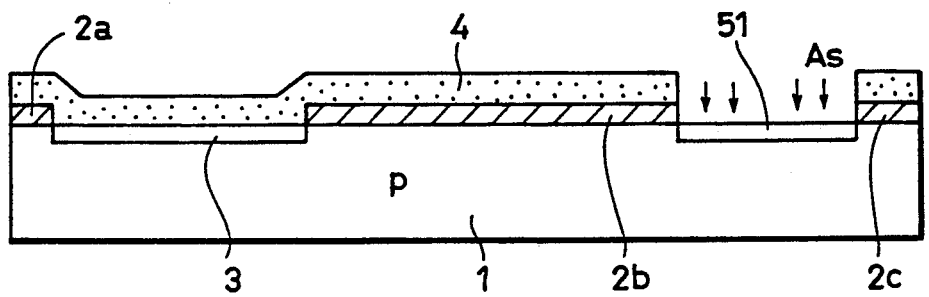

Referring to FIG. 2, a photoresistor film is applied entirely on the surface. The photoresist film is patterned to form a photoresist film 4 so as to expose only a prescribed surface region of silicon oxide film 2b. Etching is performed using photoresist film 4, to form silicon oxide films 2b and 2c so as to expose prescribed surface regions of p type silicon semiconductor substrate 1. Using the photoresist film 4 as a mask, arsenic (As) ions as an n type impurity are implanted into p type semiconductor substrate 1 under about 50 keV, in a dose of about 1.0 to $5.0 \times 10^{16}/\text{cm}^2$. An n+ diffusion layer 51 is formed in a region above which a p channel MOS transistor is subsequently formed.

Figure 3:
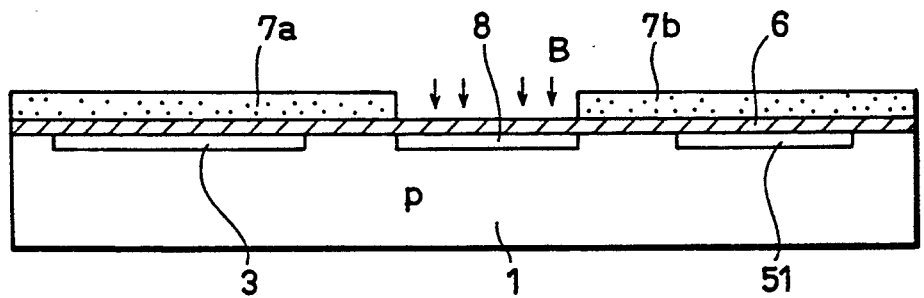

As shown in FIG. 3, after the removal of silicon oxide films 2a, 2b, and 2c, and photoresist film 4, a silicon oxide film 6 having a thickness in the range of about 1000 to 2000Å is formed on the entire surface by means of thermal oxidation, etc. A photoresist film is applied onto the silicon oxide film 6, and patterning is performed thereon to form photoresist films 7a and 7b, exposing prescribed surface regions of silicon oxide film 6. Using photoresist films 7a and 7b as masks, a p type impurity, boron (B) is ion-implanted into p type silicon semiconductor substrate 1 through silicon oxide film 6 under about 50keV, in dose of about 1.0 to $5.0 \times 10^{13}/\text{cm}^2$. A p+ diffusion layer 8 is thus formed in a region above which an n channel MOS transistor is subsequently formed.

Figure 4:
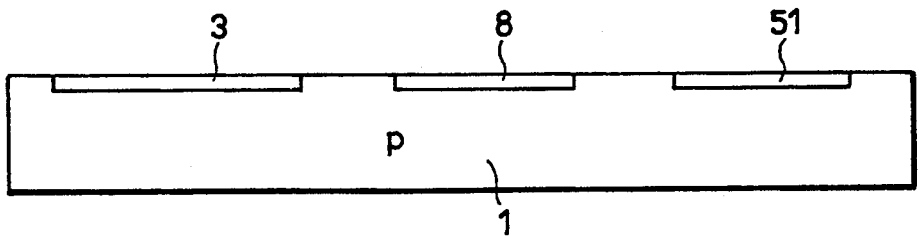

As shown in FIG. 4, silicon oxide film 6 and photoresist films 7a and 7b are removed.

Figure 5:
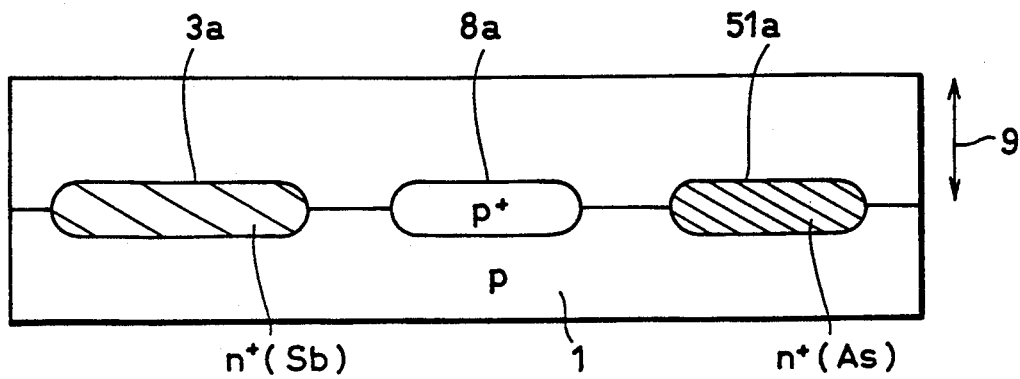

Referring to FIG. 5, the epitaxial growth of the silicon is made on the entire surface. An epitaxial layer 9 having a thickness in the range of about 0.5 to 2 μm is formed by this process. At that time, n+ diffusion layers 3 and 51, and p+ diffusion layer 8 become n+ buried layers 3a and 51a, and a p+ buried layer 8a by thermal treatment process during the epitaxial growth. N+ buried layer 3a has an impurity concentration of about $10^{19}/\text{cm}^3$. n+ buried layer 51a has an impurity concentration of about $10^{20}/\text{cm}^3$. P+ buried layer 8a has an impurity concentration of about $10^{17}/\text{cm}^3$.

Figure 6:
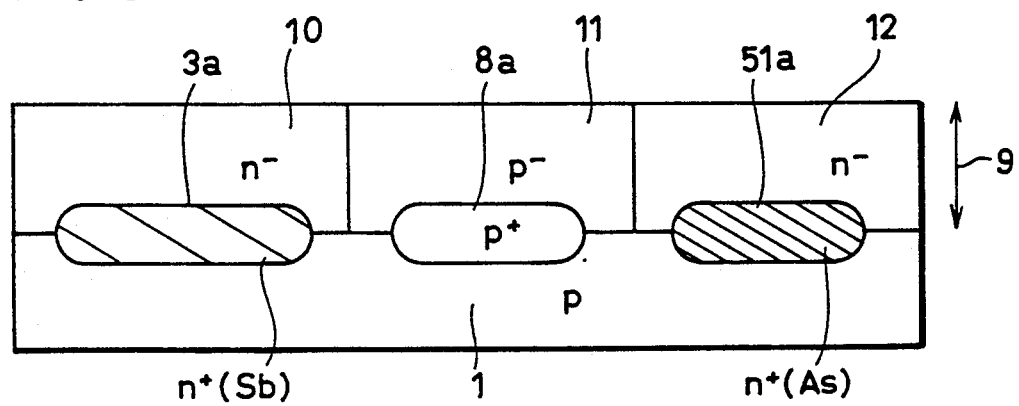

Further, as shown in FIG. 6, phosphorus ions (P) are selectively implanted in a dose of about 1.0 to $5.0 \times 10^{12}/\text{cm}^2$ only in regions in which an npn bipolar transistor and a p channel MOS transistor are subsequently formed. N− well regions 10 and 12 are simultaneously formed in the respective regions above n+ layers 3a and 51a by this process. Similarly, boron ions (B) in a dose of about 1.0 to $5.0 \times 10^{12}/\text{cm}^2$ are selectively implanted only in a region in which an n channel MOS transistor is subsequently formed. A p− well region 11 is thus formed above p+ buried layer 8a.

Figure 7:
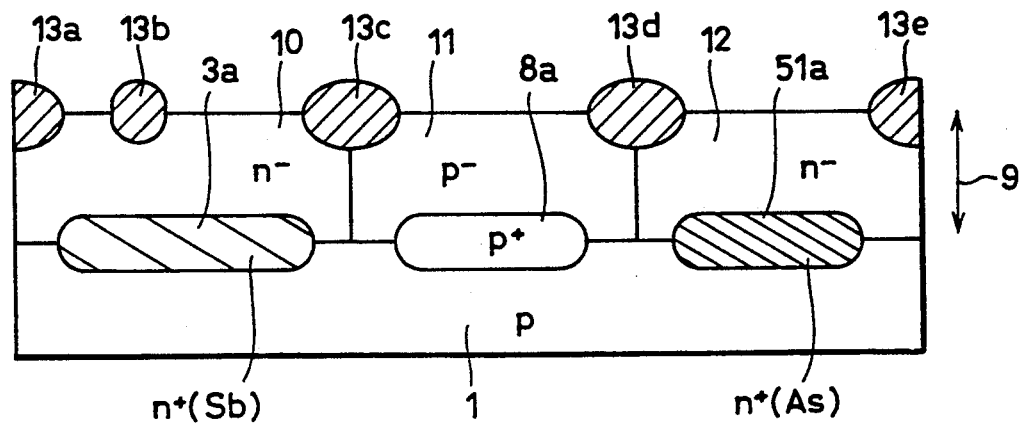

As shown in FIG. 7, oxide films for element isolation 13a to 13e spaced apart from each other are formed by means of, for example, LOCOS (Local Oxidation of Silicon).

Figure 8:
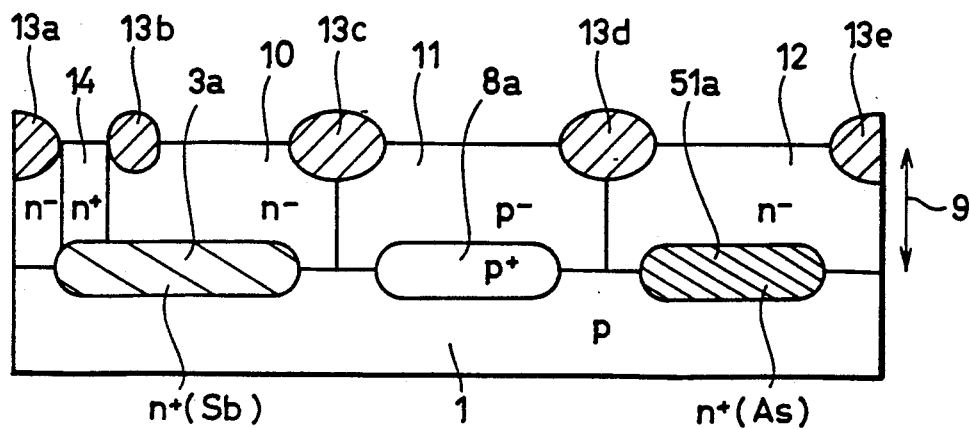

Thereafter, as shown in FIG. 8, an n type impurity such as phosphorus ions (P) is diffused in n− well region 10 to form an n+ diffusion layer 14 for connecting a collector in a region between oxide films 13a and 13b for element isolation.

Figure 9:
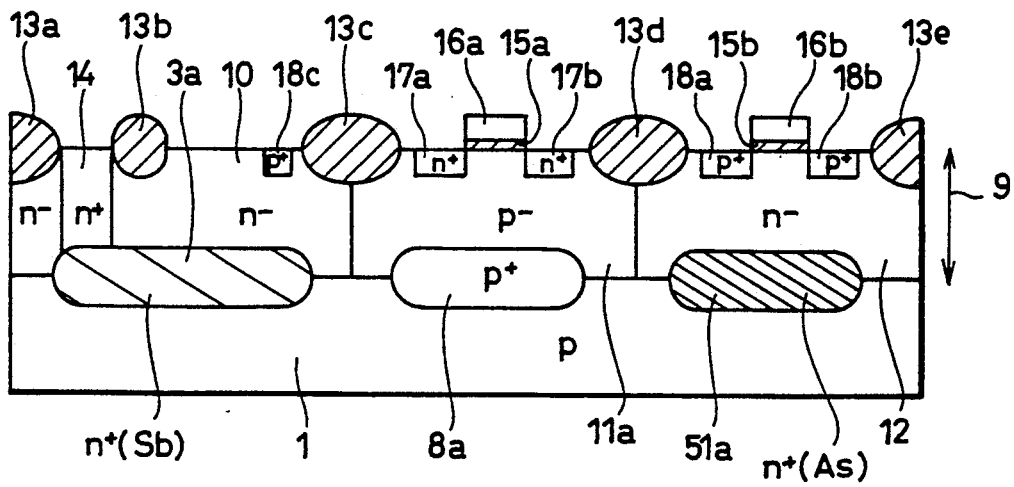
Figure 10:
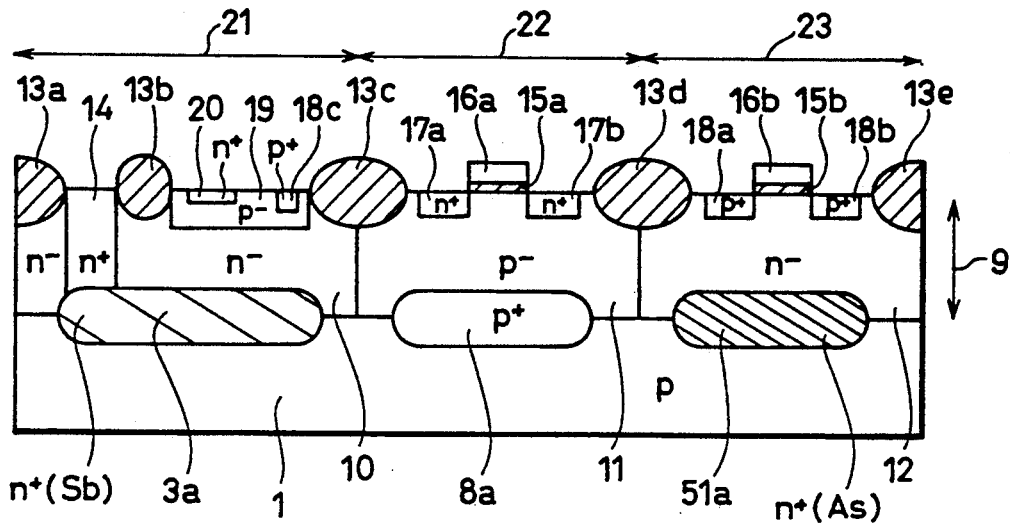

As shown in FIG. 9, formed as elements of an MOS transistor: are gate oxide films 15a and 15b; gate electrodes 16a and 16b; n+ source/drain diffusion layers 17a and 17b; source/drain diffusion layers 18a and 18b. A p+ diffusion layer 18c for connecting a base is formed in the same manner. Finally, a p− base region 19, and an n emitter region 20 are formed, and, therefore, an npn bipolar transistor, an n channel MOS transistor 22, and a p channel MOS transistor 23 are formed. Thereafter, as practiced in a conventional large scale integrated circuit device (LSI), wirings are provided between the transistors by forming contact holes, aluminum wirings, etc. A Bi-CMOS type semiconductor device in accordance with the present invention is thus completed.

In the above-described embodiment, the impurity concentration of n+ buried layer 51a is about $10^{20}/\text{cm}^3$, and the impurity concentration of n+ buried layer 3a is about $10^{19}/cm^3$, because arsenic (As) is higher than antimony (Sb) in solid solubility into silicon. The impurity concentration of n+ buried layer 51a in the region in which an MOS transistor is formed is ten times higher than that of n+ buried layer 3a in the bipolar transistor formation region. Thus, the formation of a punch through between the p+ source/drain diffusion layers 18a and 18b of p channel MOS transistor 23 formed in n− well region 12 is prevented, and an improved latch up tolerance is obtained in the CMOS region in which n channel MOS transistor 22 and p channel MOS transistor 23 are formed.

SECOND EMBODIMENT

Figure 11:
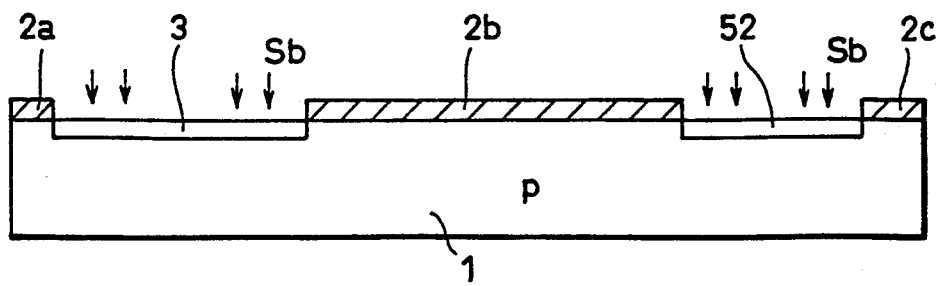
FIGS. 11 to 15 are sectional views showing a second embodiment of the manufacturing method of the semiconductor device in each manufacturing process in accordance with the present invention.

FIGS. 11 to 15 are sectional views showing another embodiment of a method of forming a buried layer in a semiconductor device in accordance with the present invention in its manufacturing order. Referring to FIG. 11, antimony (Sb) ions are implanted into p type silicon semiconductor substrate 1 under the same implantation conditions as those of the above-described first embodiment in regions above which an npn bipolar transistor and a p channel MOS transistor are subsequently formed, using as masks silicon oxide films 2a, 2b, and 2c formed in the same manner as that of the first embodiment N+ diffusion layers 3 and 52 are thus formed.

Figure 12:
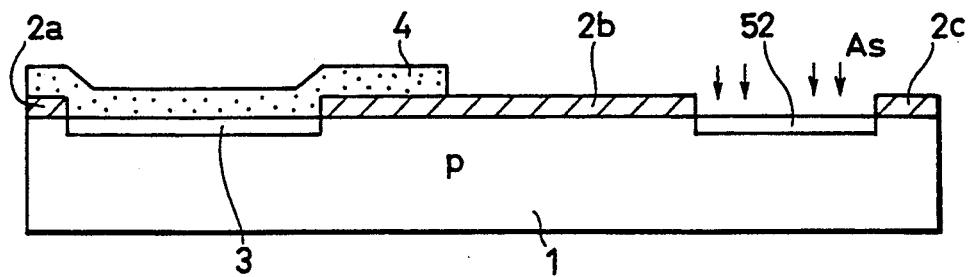

As shown in FIG. 12, using silicon oxide films 2b and 2c as masks under the same implantation conditions as those of the above-described first embodiment, arsenic (As) ions are implanted only in the region underlying the region in which p channel MOS transistor is formed, in other words only in the region of n+ diffusion layer 52, as in the above-described first embodiment. At that time, the region of n+ diffusion layer 3 is covered with a photoresist film 4. Similar effects to the first embodiment can thus be obtained even if the n+ diffusion layer 52 of the p channel MOS transistor formation region is formed.

Figure 13:
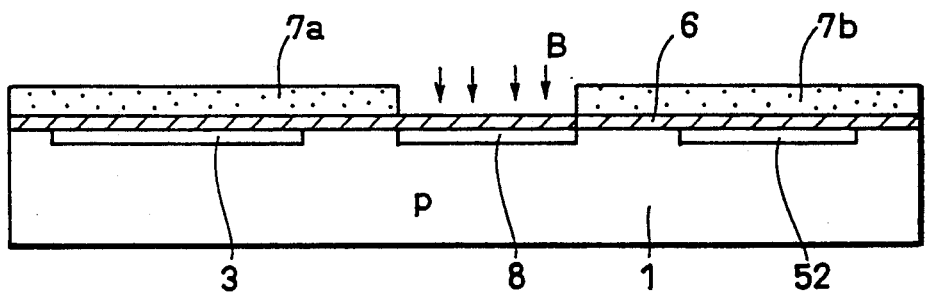
Figure 14:
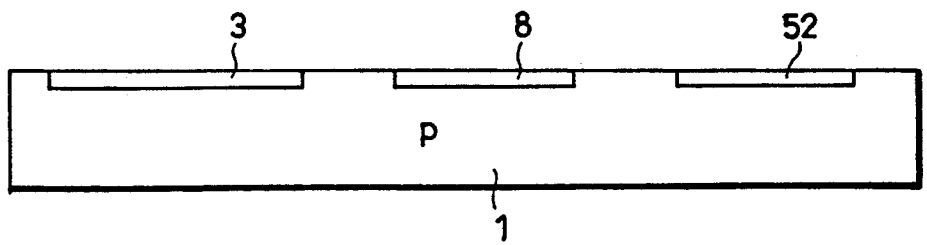

The formation process of p diffusion layer 8 shown in FIGS. 13 and 14 is identical to the process shown in FIGS. 3 and 4. The process thereafter is entirely identical to the above-described first embodiment.

Figure 15:
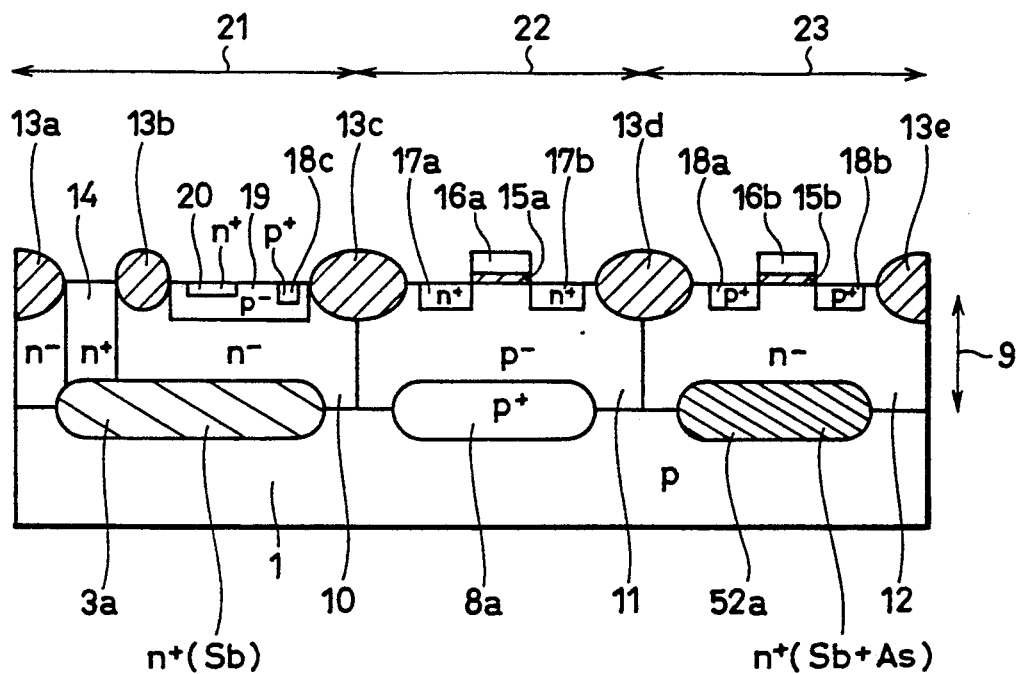

The semiconductor device of Bi-CMOS type in accordance with the present invention as shown in FIG. 15 is thus completed. N+ diffusion layers 3, 52 and p+ diffusion layer 8 are made into n+ buried layers 3a, 52a and p+ buried layers 8a, respectively by means of thermal treatment during the growth of epitaxial layer 9.

In the second embodiment, a method of additionally implanting arsenic only in the region of n diffusion layer 52 after the implantation of antimony is employed for the following reasons.

In the first embodiment, arsenic and antimony are implanted using implantation masks (silicon oxide films 2a, 2b and photoresist film 4) formed by separate photolithography processes. According to this method, however, misalignment of photoresist film 4 shown in FIG. 2 to n+ diffusion layer 3 takes place in patterning by photolithography technique, and n+ diffusion layers 3 and 51 cannot be formed to be self-aligned. On the other hand, in the second embodiment, arsenic and antimony are implanted using implantation masks (silicon oxide films 2a, 2b and 2c) formed in the same photolithography process, and, therefore n+ diffusion layers 3 and 52 can be self-aligned.

Figure 16:
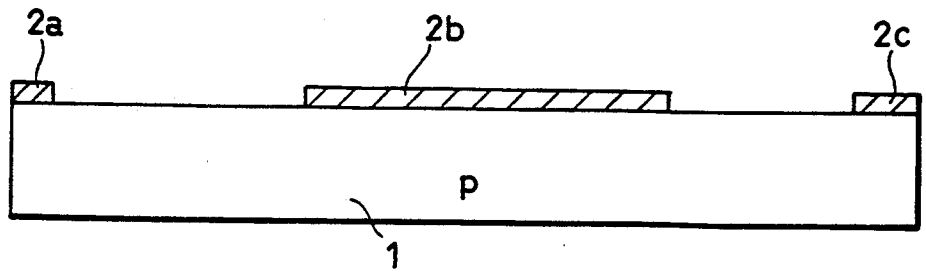
FIGS. 16 to 18 are sectional views showing an alternative of the first embodiment of the manufacturing method of the semiconductor device in each manufacturing process in accordance with the present invention.
Figure 17:
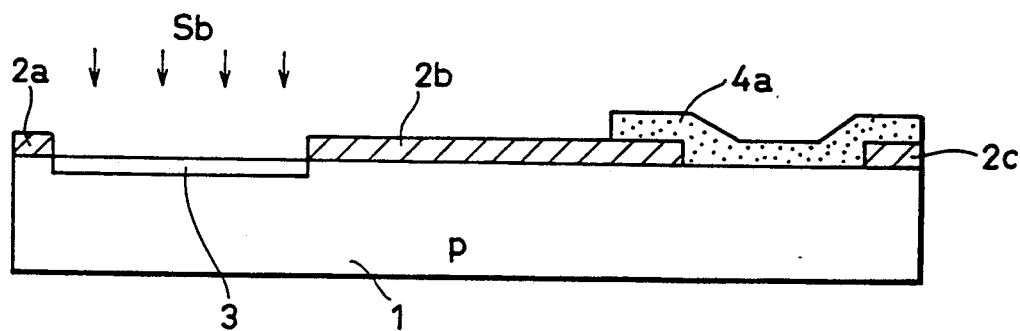
Figure 18:
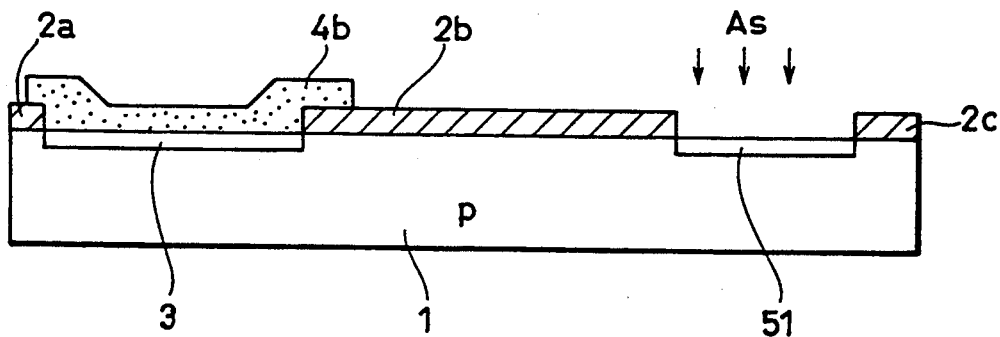

It is also possible to form n+ diffusion layers 3 and 51 in a self-aligned manner by separately implanting impurity ions, but one more photolithography process will be necessary. FIGS. 16–18 are sectional views showing one embodiment of a manufacturing method in this case in the order of manufacture.

Similarly to the case of the first and second embodiments as shown in FIG. 16, a silicon oxide film of a thickness in the range between about 1000–3000Å is formed by, for example, thermal oxidation entirely on the surface of a p type silicon semiconductor substrate. The silicon oxide film is patterned using usual photolithography technique and silicon oxide film etching technique, and silicon oxide films 2a, 2b and 2c are formed exposing only a prescribed region of p type silicon semiconductor substrate 1.

After a photoresist film is applied on the entire surface as shown in FIG. 17, patterning is performed to form a photoresist film 4a. Using this photoresist film 4a and the above-stated silicon oxide films 2a, 2b and 2c as masks, antimony (Sb) is implanted at about 50keV in a dose amount of about $1.0–5.0 \times 10^{15}/cm^2$, and n+ diffusion layer 3 is formed only in the region in which npn bipolar transistor is to be formed.

Then, after photoresist film 4a is removed as shown in FIG. 18, a photoresist film is applied on the entire surface, and patterning is performed thereon to form a photoresist film 4b. Using this photoresist film 4b and silicon oxide films 2a, 2b and 2c as mask, arsenic (As) is implanted at about 50keV in a dose amount of about $1.0–5.0 \times 10^{16}/cm^2$, and n+ diffusion layer 51 is formed only in the region in which a p channel MOS transistor is to be formed.

It is possible to form n+ diffusion layers 3 and 51 in a self-aligned manner according to the process stated above, but there still exists a problem of manufacturing cost increase because one more extra photolithography process, in other words three times in total will be necessary for forming n+ diffusion layers 3 and 51.

THIRD EMBODIMENT

The foregoing two embodiments are described by referring to the cases in which an npn bipolar transistor is formed, and description will be given in the following on the case in which a pnp bipolar transistor is formed.

FIGS. 19 to 23 are sectional views showing one embodiment of a method of forming a buried layer in its manufacturing order when a Bi-CMOS type semiconductor device including a pnp bipolar transistor is formed.

Figure 19:
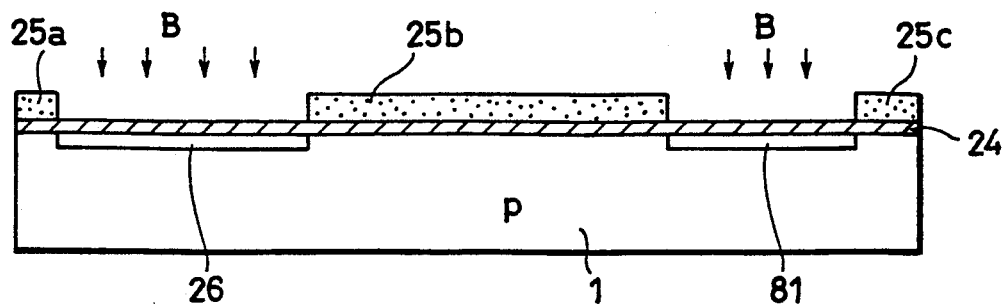
FIGS. 19 to 23 are sectional views showing a third embodiment of the manufacturing method of the semiconductor device in each manufacturing process in accordance with the present invention.

Referring to FIG. 19, a silicon oxide film 24 having a thickness in the range of about 1000 to 2000Å is formed on the main surface of a p type silicon semiconductor substrate 1 by means of thermal oxidation, etc. A photoresist film is formed on silicon oxide film 24. The photoresist film is patterned to form photoresist films 25a, 25b, and 25c so as to expose only a prescribed surface region of silicon oxide film 24. Using photoresist film 25a, 25b, and 25c as masks, boron ions (B) are implanted into p type silicon semiconductor substrate 1 through silicon oxide film 24 as shown by arrows, for example, under about 50keV, in a dose of about 1.0 to $5.0 \times 10^{13}/cm^2$. P+ diffusion layers 26 and 81 are formed in regions underlying the regions in which a pnp bipolar transistor and an n channel MOS transistor are subsequently formed.

Figure 20:
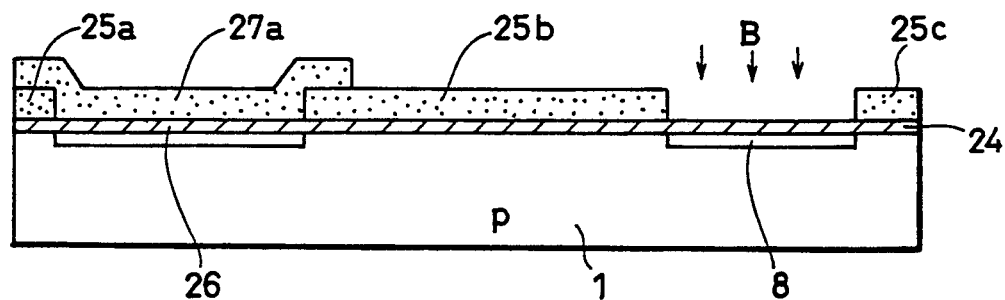

As shown in FIG. 20, a photoresist film is formed entirely on the surface. The photoresist film is selectively removed so as to expose only the region underlying the region in which the n channel MOS transistor is to be formed. Photoresist films 27a and 27b are thus formed. Thereafter, using photoresist films 27a and 27b as masks, boron ions (B) are implanted into p+ diffusion layer 81 through silicon oxide film 24, for example, under about 50keV, in a dose of approximately 1.0 to $5.0 \times 10^{13}/cm^2$.

Figure 21:
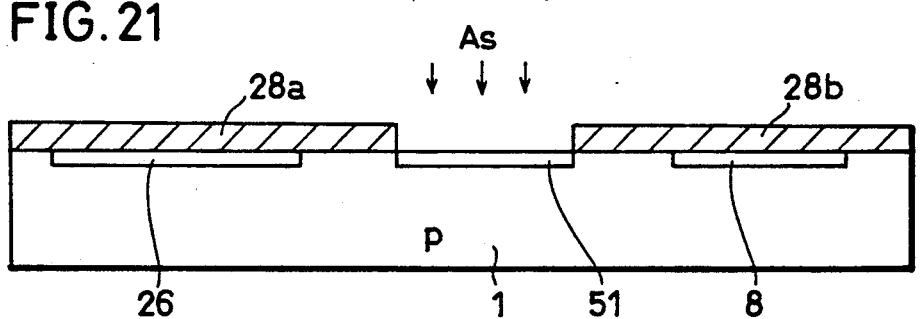

As shown in FIG. 21, silicon oxide films 24, and photoresist films 25a, 25b, 25c, 27a, and 27b are removed. A silicon oxide film is once again formed entirely on the surface. The silicon oxide film is selectively removed, so as to expose only a region underlying the region in which the p channel MOS transistor is subsequently formed, thereby forming silicon oxide film 28a and 28b. Using silicon oxide film 28a and 28b as masks, arsenic (As) ions are implanted into p type silicon semiconductor substrate 1 as shown by arrows under about 50keV, in a dose of approximately 1.0 to $5.0 \times 10^{16}/cm^2$. An n+ diffusion layer 51 is thus formed.

Figure 22:
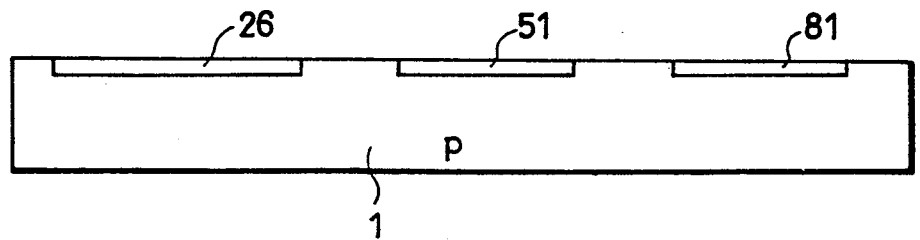
Figure 23:
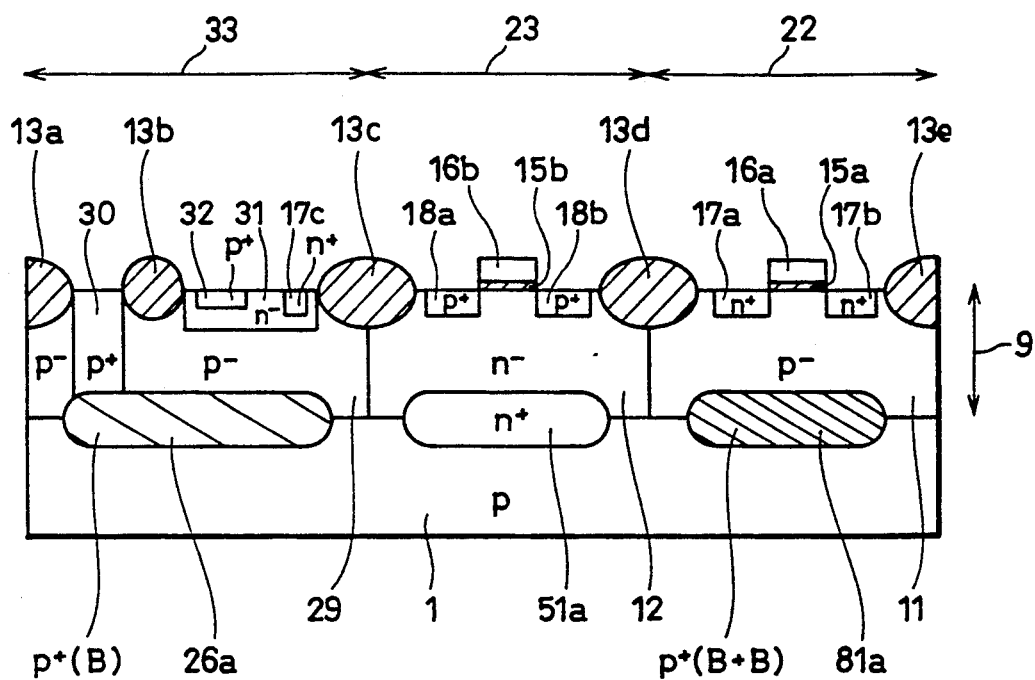
Figure 24:
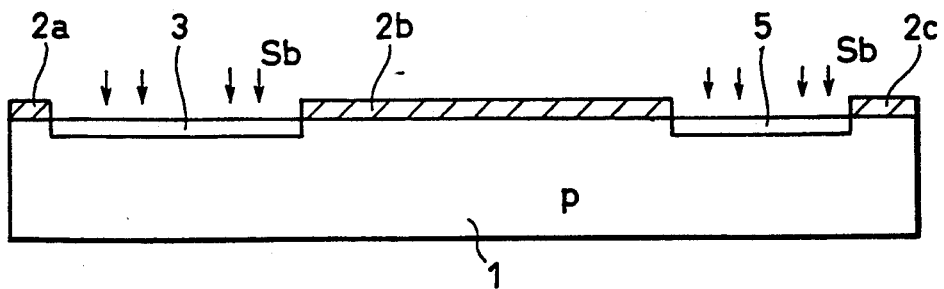
FIGS. 24 to 29 are sectional views showing the first process of a manufacturing method of a conventional semiconductor device.
Figure 25:
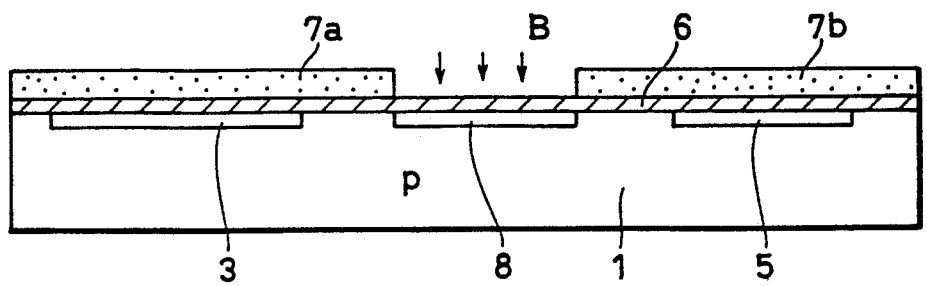
Figure 26:
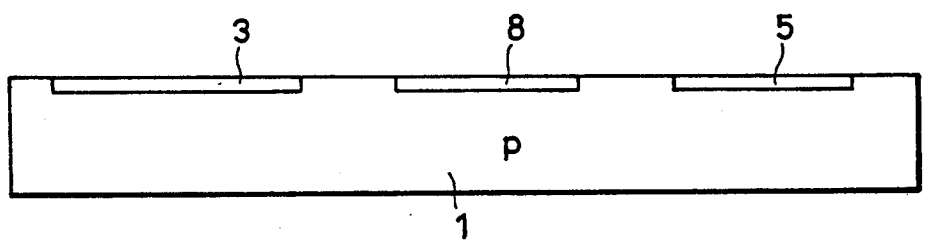
Figure 27:
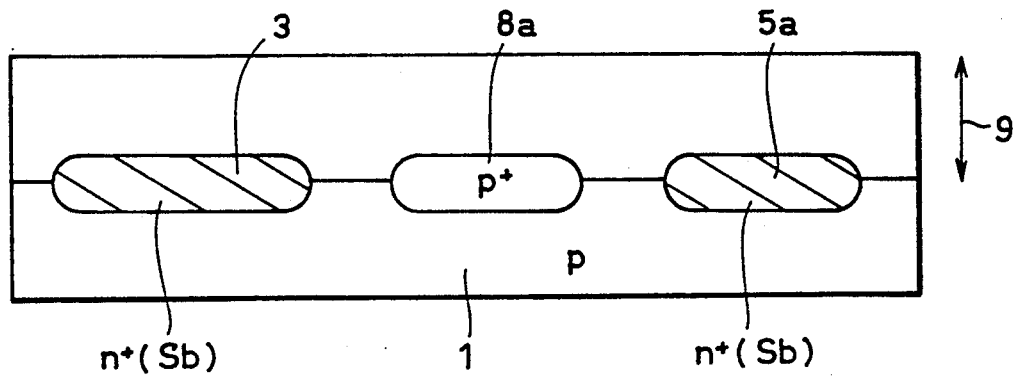
Figure 28:
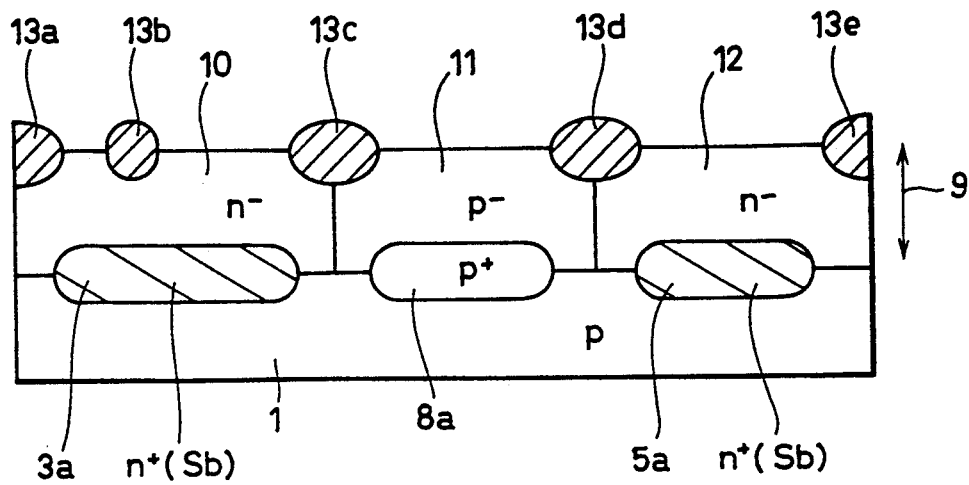
Figure 29:
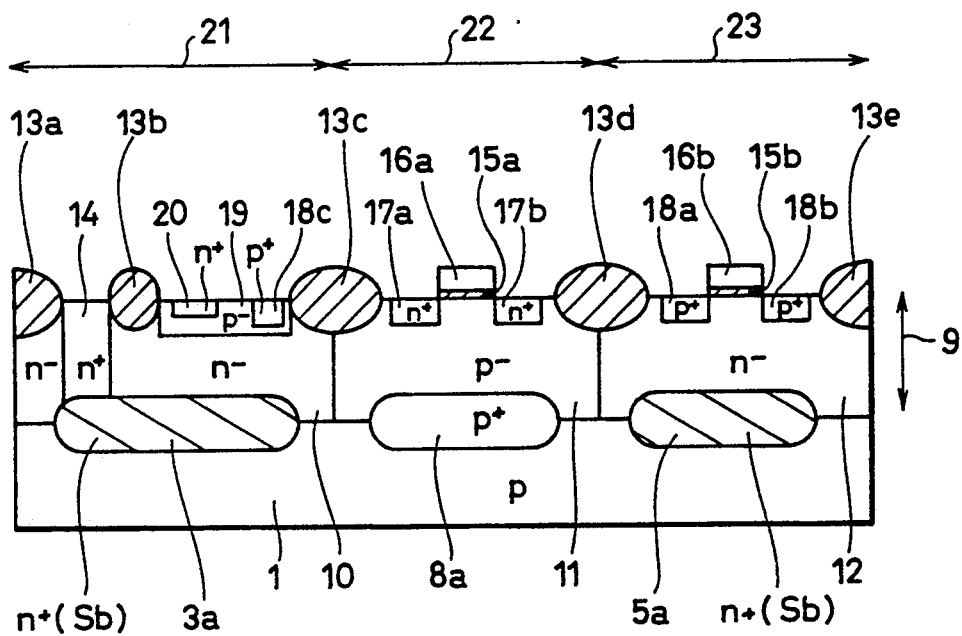
Figure 30:
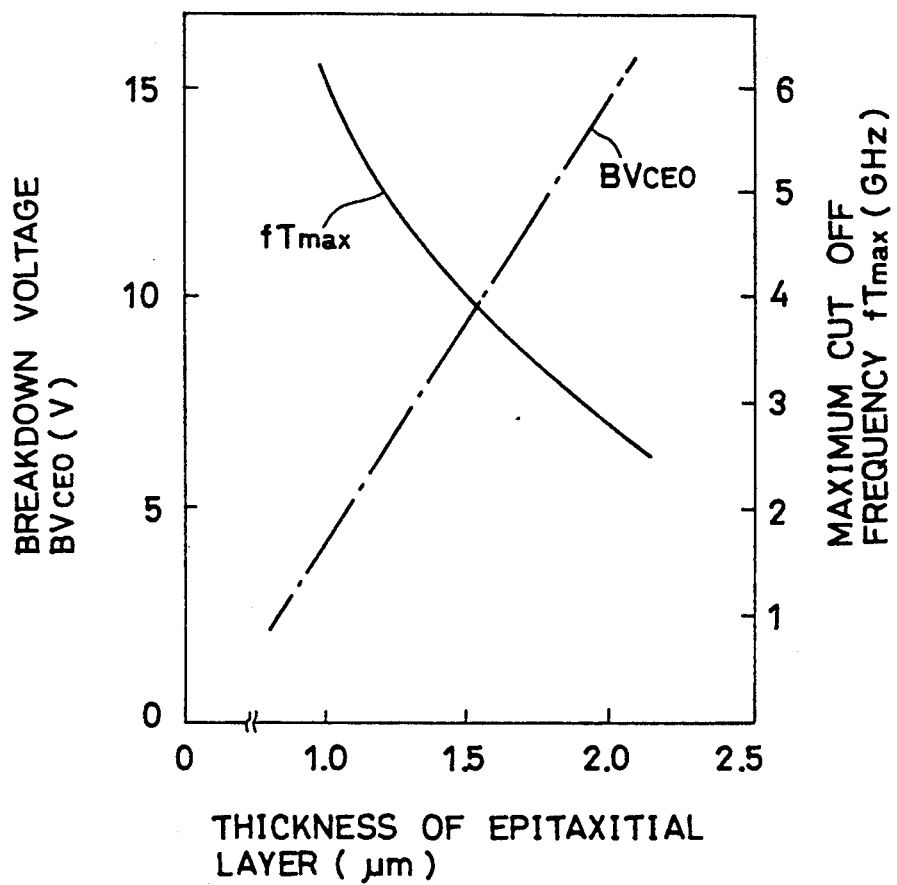
FIG. 30 is a graphic representation showing the relation between the parameters of a bipolar transistor and the thickness of an epitaxial layer.
Figure 31:
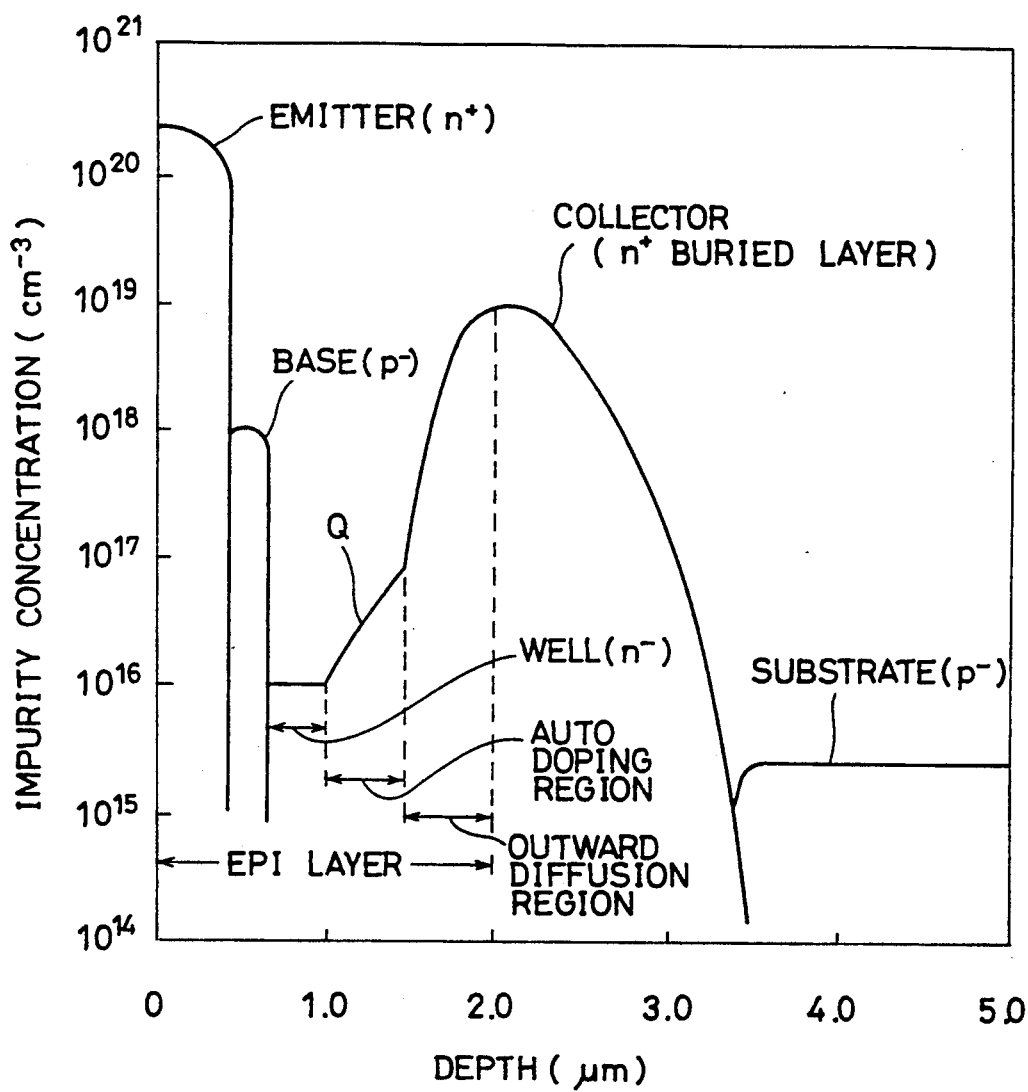
FIG. 31 is a graphic representation showing the impurity concentration profile in depth of a typical npn bipolar transistor.
Figure 32:
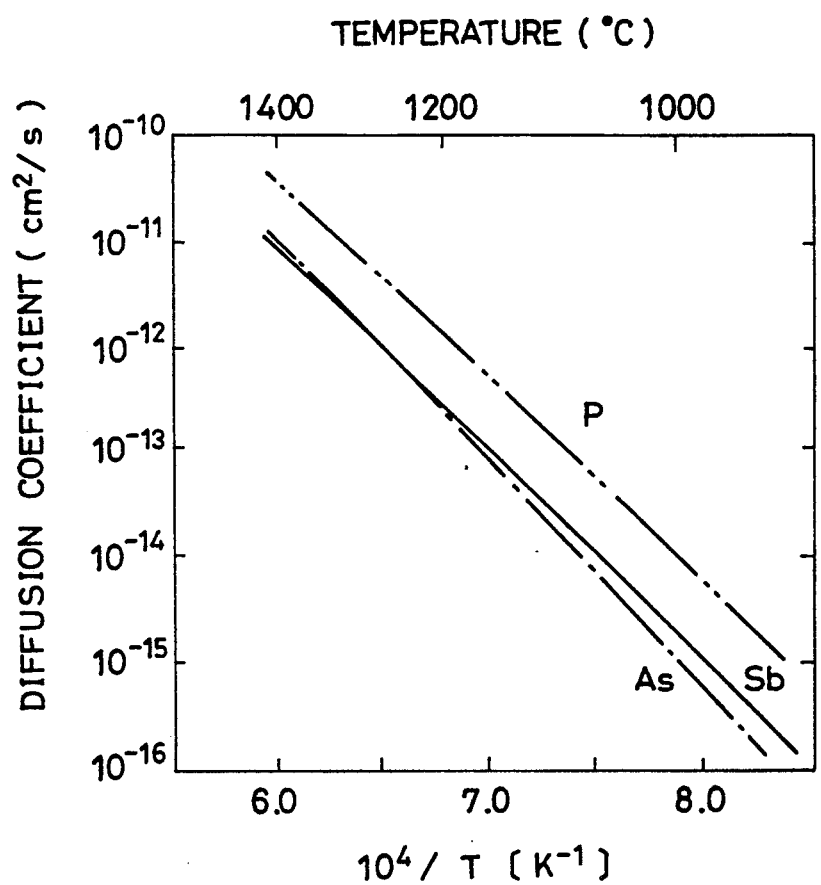
FIG. 32 is a graphic representation showing the temperature dependence of the diffusion coefficients of phosphorus (P), arsenic (As), and antimony (Sb) in silicon.
Figure 33:
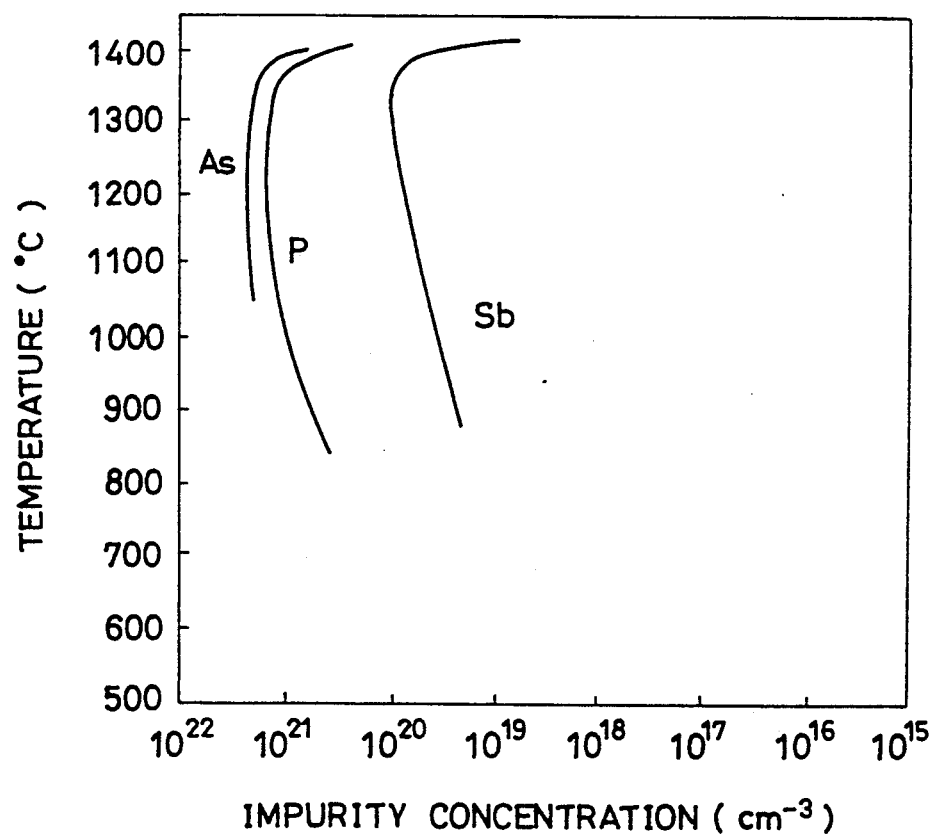
FIG. 33 is a graphic representation showing the solid solubilities of arsenic (As), phosphorus (P), and antimony (Sb) into silicon.
Figure 34:
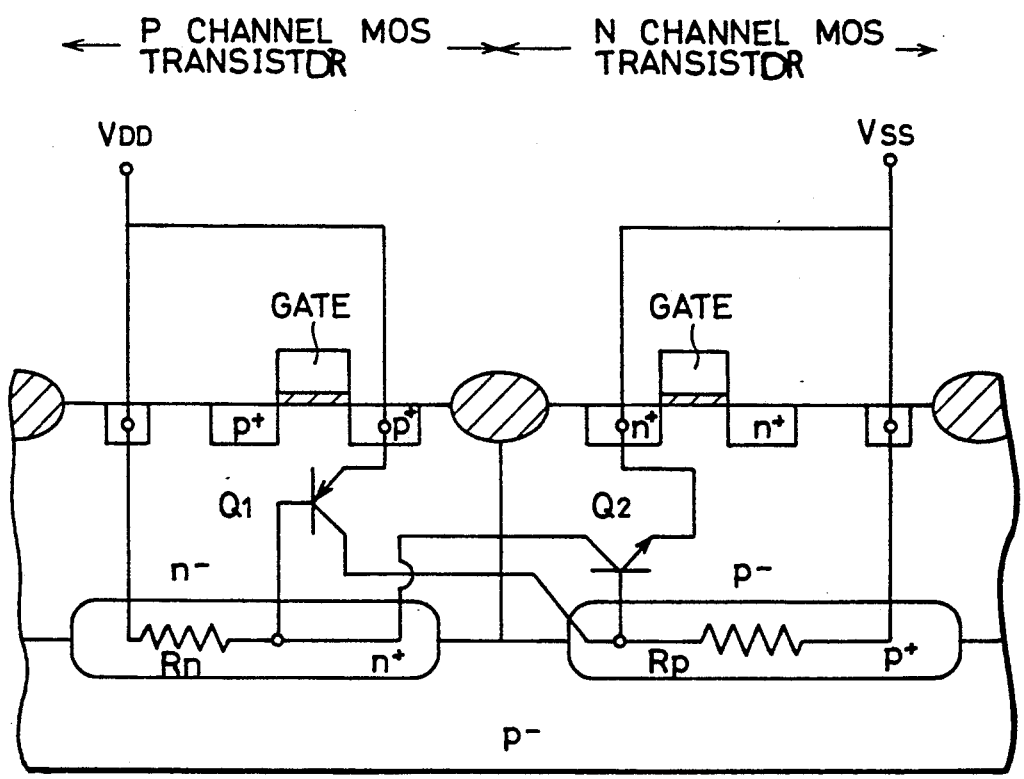
FIG. 34 is a sectional view schematically showing one example of a parasitic thyristor formed in a complementary MOS transistor in a Bi-CMOS type semiconductor device

As shown in FIG. 22, silicon oxide films 28a and 28b are removed. Thereafter, as shown in FIG. 5 and as similar to the case of the first embodiment, the epitaxial growth of silicon is carried out entirely on the surface. At that time, p+ diffusion layers 26 and 81, and n+ diffusion layer 51 become p+ buried layers 26a and 81a, and an n+ buried layer 51a, respectively by means of thermal treatment during the epitaxial growth (FIG. 23). In this case, p+ buried layer 26a is formed in place of n+ layer 3a in FIG. 5. The impurity concentration of p+ buried layer 26a in the region for forming the pnp bipolar transistor is about $10^{17}/cm^3$, and on the other hand, the impurity concentration of p+ buried layer 81a in the region for forming the n channel MOS transistor is approximately ten times higher $10^{18}/cm^3$.

Subsequent process is substantially identical to the above-stated first and second embodiments.

More specifically, as shown in FIG. 23, a pnp bipolar transistor 33, an n channel MOS transistor 22, a p channel MOS transistor 23 are formed by sequentially forming n-well region 12, p− well regions 11, 29, oxide films 13a–13e for element isolation, p+ diffusion layers 30 for connecting a collector, the gate oxide films 15a and 15b of MOS transistors, gate electrodes 16a and 16b, n+ source/drain diffusion layers 17a, 17b, n+ diffusion layer 17c for connecting a base, p+ source/drain diffusion layers 18a, 18b, n− base region 31, and p emitter region 32. A semiconductor device of Bi-CMOS type in accordance with the present invention is thus completed.

As described above, in the Bi-CMOS type semiconductor device including the pnp bipolar transistor, the impurity concentration of the buried layer in the region of the n channel MOS transistor can be made higher than the impurity concentration of the buried layer in the region of the pnp bipolar transistor. Similar effects to those in the first embodiment can therefore be obtained.

As in the foregoing, according to the present invention, the impurity concentration of a buried layer in a region for forming an insulating gate field effect transistor is higher than the impurity concentration of a buried layer having the same conductivity type in a region for forming a bipolar transistor. The expansion of the drain depletion layer in the insulating gate field effect transistor toward the semiconductor substrate is thus greatly restrained. The formation of a punch through between the source-drain of a field effect transistor located inside a semiconductor layer formed on the buried layer by the epitaxial growth can be effectively prevented.

The operation of a parasitic thyristor in a complementary insulating gate field effect transistor can also be restrained. The latch up tolerance of a semiconductor device in accordance with the present invention can thus be improved.

Furthermore, in a semiconductor device in accordance with the present invention, in addition to the improvements in the performance of the above-described complementary insulating gate field effect transistor, a desired high performance is maintained in the bipolar transistor without any deterioration. According to the present invention, the above-described effects are especially prominent if the thickness of a semiconductor layer formed by means of epitaxial growth is reduced to less than 2 μm in accordance with the scaling law.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including in a semiconductor substrate, insulating gate field effect transistors and bipolar transistors, comprising:

a semiconductor substrate having a main surface;

a first buried semiconductor layer containing impurities of a first conductivity type with a first concentration, and formed on the main surface of said semiconductor substrate;

a second buried semiconductor layer including impurities of the first conductivity type with a second concentration higher than said first concentration, and formed on the main surface of said semiconductor substrate;

a first semiconductor layer of the first conductivity type formed on said first buried semiconductor layer;

a second semiconductor layer of the first conductivity type formed on said second buried semiconductor layer;

a bipolar transistor formed in a region of said first semiconductor layer and using as a base a semiconductor region of a second conductivity type formed in said first semiconductor layer; and a field effect transistor of the second conductivity type formed in a region of said second semiconductor layer.

2. The semiconductor device in accordance with claim 1, wherein said first semiconductor layer and said second semiconductor layer have the same impurity concentration.

3. The semiconductor device in accordance with claim 1, wherein said first semiconductor layer and said second semiconductor layer have thicknesses of not more than 2 μm.

4. The semiconductor device in accordance with claim 1, wherein
said first buried semiconductor layer contains antimony, and said second buried semiconductor layer contains arsenic.

5. The semiconductor device in accordance with claim 1, wherein said first concentration is approximately one tenth said second concentration.

6. The semiconductor device in accordance with claim 1, wherein said first buried semiconductor layer contains antimony, and
said second buried semiconductor layer contains antimony and arsenic.

7. A semiconductor device including in a semiconductor substrate, insulating gate field effect transistors and bipolar transistors, comprising:
   a semiconductor substrate having a main surface;
   a first buried semiconductor layer containing impurities of a first conductivity type with a first concentration, and formed on the main surface of said semiconductor substrate;
   a second buried semiconductor layer including impurities of the first conductivity type with a second concentration higher than said first concentration, and formed on the main surface of said semiconductor substrate;
   a third buried semiconductor layer containing impurities of a second conductivity type formed on the main surface of said semiconductor substrate;
   a first semiconductor layer of the first conductivity type formed on said first buried semiconductor layer;
   a second semiconductor layer of the first conductivity type formed on said second buried semiconductor layer;
   a third semiconductor layer of the second conductivity type formed on said third buried semiconductor layer;
   a bipolar transistor formed in a region of said first semiconductor layer and using as a base a semiconductor region of the second conductivity type formed in said first semiconductor layer;
   a field effect transistor of the second conductivity type formed in a region of said second semiconductor layer; and
   a field effect transistor of the first conductivity type formed in the region of said third semiconductor layer.

8. A semiconductor device including in a semiconductor substrate, insulating gate field effect transistors and bipolar transistors, comprising:
   a semiconductor substrate having a main surface;
   a first buried semiconductor layer containing impurities of a first material and formed on the main surface of said semiconductor substrate;
   a second buried semiconductor layer including impurities of said first material and a second material different from the first material and formed on the main surface of said semiconductor substrate;
   a first semiconductor layer of the first conductivity type formed on said first buried semiconductor layer;
   a second semiconductor layer of the first conductivity type formed on said second buried semiconductor layer;
   a bipolar transistor formed in a region of said first semiconductor layer and using as a base a semiconductor region of a second conductivity type formed in said first semiconductor layer; and
   a field effect transistor of the second conductivity type formed in a region of second semiconductor layer.

9. The semiconductor device in accordance with claim 8, wherein a concentration of impurities in said second buried semiconductor layer is greater than concentration of impurities in said first buried semiconductor layer.

10. The semiconductor device in accordance with claim 8, wherein
    said first buried semiconductor layer contains antimony, and said second buried semiconductor layer contains arsenic and antimony.

11. The semiconductor device in accordance with claim 8, wherein
    said first and second buried semiconductor layers include impurity ions of a first conductivity type having a first solid solubility in said semiconductor substrate, and
    said second buried semiconductor layer includes impurity ions of the first conductivity type and wherein the second material has a second solid solubility higher than said first solid solubility in said semiconductor substrate.

12. A semiconductor device including in a semiconductor substrate, insulating gate field effect transistors and bipolar transistors, comprising:
    a semiconductor substrate having a main surface;
    a first buried semiconductor layer containing impurities of a first material and formed of a first conductivity type on the main surface of said semiconductor substrate;
    a second buried semiconductor layer including impurities of said first material and a second material different from the first material and formed of the first conductivity type on the main surface of said semiconductor substrate;
    a third buried semiconductor layer containing impurities of a second conductivity type formed on the main surface of said semiconductor substrate;
    a first semiconductor layer of the first conductivity type formed on said first buried semiconductor layer;
    a second semiconductor layer of the first conductivity type formed on said second buried semiconductor layer;
    a third semiconductor layer of the second conductivity type formed on said third buried semiconductor layer;
    a bipolar transistor formed in a region of said first semiconductor layer and using as a base a semiconductor region of the second conductivity type formed in said first semiconductor layer;
    a field effect transistor of the second conductivity type formed in a region of said second semiconductor layer, and
    a field effect transistor of the first conductivity type formed in the region of said third semiconductor layer.

* * * * *